US 6,590,238 B1

(12) United States Patent
Parks

(10) Patent No.: US 6,590,238 B1
(45) Date of Patent: Jul. 8, 2003

(54) IMAGE SENSOR HAVING A CAPACITANCE CONTROL GATE FOR IMPROVED GAIN CONTROL AND ELIMINATING UNDESIRED CAPACITANCE

(75) Inventor: Christopher Parks, Rochester, NY (US)

(73) Assignee: Eastman Kodak Company, Rochester, NY (US)

( * ) Notice: Subject to any disclaimer, the term of this patent is extended or adjusted under 35 U.S.C. 154(b) by 0 days.

(21) Appl. No.: 10/074,519

(22) Filed: Feb. 12, 2002

(51) Int. Cl.⁷ .................. H01L 27/148; H01L 29/768
(52) U.S. Cl. ....................... 257/226; 257/215
(58) Field of Search ................. 438/215, 216, 438/226, 239, 250, 317, 462; 257/215, 216, 219, 226, 239, 249, 250

(56) References Cited

U.S. PATENT DOCUMENTS 5,495,441 A * 2/1996 Hong
5,612,554 A * 3/1997 Funakoshi

* cited by examiner

*Primary Examiner*—David Nelms
*Assistant Examiner*—Phuc T. Dang
(74) *Attorney, Agent, or Firm*—Peyton C. Watkins

(57) ABSTRACT

A charge-coupled device includes a plurality of cells for forming the charge-coupled device, each of the cells capable of retaining charge a transfer mechanism within the charge-coupled device for moving charge through the plurality of cells, an output region for receiving charge moved through the plurality of cells under control of the transfer mechanism; a floating diffusion to receive charge moved across the output region; a reset gate to remove charge from the floating diffusion and reset the floating diffusion to a reference voltage level; and a capacitance control gate adjacent to the floating diffusion for canceling capacitance coupling of the reset gate. A capacitance control gate covers a portion of the floating diffusion. The capacitance control gate voltage is adjusted to alter the capacitance of the floating diffusion. The capacitance control gate is clocked opposite that of the reset gate to cancel the capacitive effects of the reset gate.

2 Claims, 4 Drawing Sheets

IMAGE SENSOR HAVING A CAPACITANCE CONTROL GATE FOR IMPROVED GAIN CONTROL AND ELIMINATING UNDESIRED CAPACITANCE

FIELD OF THE INVENTION

The invention relates generally to the field of image sensors and, more particularly, to such image sensors having a capacitive control gate for eliminating an undesired capacitive effect caused by a reset gate on a floating diffusion and controlling the capacitance of a floating diffusion.

BACKGROUND OF THE INVENTION

As shown in FIGS. 1 and 2, prior art charge-coupled devices 10 typically include a substrate 20 of a p-type having a buried channel 30 of the n-type for transferring charge packets of electrons. A plurality of gates 40 (two gates for the two-phase device shown in FIG. 1) are connected to the buried channel 30 for controlling charge packet transfer in the buried channel 30. A non-clocked output gate 50 is positioned between one of the gates 40a and a floating diffusion 60 for preventing capacative coupling of the last clocked gate 40a to the floating diffusion 60.

The floating diffusion 60 provides a mechanism for sensing the size of the charge packet for subsequent measurement and the like. A reset transistor 70 provides a mechanism for resetting the voltage level of the floating diffusion after appropriate sampling. A reset drain 80 is adjacent the reset transistor 70 for receiving drained charge from the floating diffusion 60, as is well known in the art.

Referring to FIG. 3, a typical timing sequence of the charge-coupled device 10 is shown. At time T0, the reset gate 70 is clocked high. This turns on the reset transistor 70 and resets the floating diffusion 60 to the reference voltage of the reset drain 80. Then at time T1, the reset gate 70 is clocked low. Capacitive coupling (represented by $C_{reset}$) between the reset gate 70 and the floating diffusion 60 causes the voltage of floating diffusion 60 to be pushed to a more negative voltage when the reset gate 70 is turned off. The floating diffusion 60 voltage then remains stable and is sampled at time T2. Then at time T3, the gates 40 are clocked which changes their levels and transfers a new charge packet over the output gate 50 and onto the floating diffusion 60. The magnitude of the voltage change at time T3 on the floating diffusion 60 is proportional to the size of the charge packet and the capacitance of the floating diffusion 60. The relationship is given by V=Q/C where V is the voltage change, Q is the size of the charge packet (coulombs), and C is the capacitance of the floating diffusion (farads). The new voltage on the floating diffusion 60 is sampled at time T4 and then the timing cycle is repeated.

Although the currently known and utilized sensor and associated method for transferring charge is satisfactory, it includes drawbacks. The shortcoming of the output structure is the capacitive coupling of the reset gate to the floating diffusion, which causes the voltage glitch between times T0 and T1 on the amplifier input node. This short glitch also restricts the type of electronics that are used to process the output signal of the CCD. Another disadvantage of the prior art is the voltage change of the floating diffusion is fixed to a constant value by the floating diffusion capacitance. Consequently, it is desirable to have a structure, which allows the voltage gain to be changed for some means of altering the floating diffusion capacitance, and which eliminates undesired capacative coupling of the reset gate 70.

SUMMARY OF THE INVENTION

The present invention is directed to overcoming one or more of the problems set forth above. Briefly summarized, according to one aspect of the present invention, the invention is a charge-coupled device having a plurality of cells for forming the charge-coupled device, each of the cells capable of retaining charge; a transfer mechanism within the charge-coupled device for moving charge through the plurality of cells; an output region for receiving charge moved through the plurality of cells under control of the transfer mechanism; a floating diffusion to receive charge moved across the output region; a reset gate to remove charge from the floating diffusion and reset the floating diffusion to a reference voltage level; and a capacitance control gate adjacent to the floating diffusion for canceling capacitance coupling of the reset gate. A capacitance control gate covers a portion of the floating diffusion and the voltage of the capacitance control gate is adjusted to alter the capacitance of the floating diffusion. The capacitance control gate is clocked opposite that of the reset gate to cancel the capacitive effects of the reset gate.

These and other aspects, objects, features and advantages of the present invention will be more clearly understood and appreciated from a review of the following detailed description of the preferred embodiments and appended claims, and by reference to the accompanying drawings.

ADVANTAGEOUS EFFECT OF THE INVENTION

The present invention has the following advantages of producing a smoother waveform going to the CCD amplifier input, which is easier for the electronics of the camera to process. The present invention also provides a means for changing the effective gain of the CCD output.

DETAILED DESCRIPTION OF THE INVENTION

Figure 1:
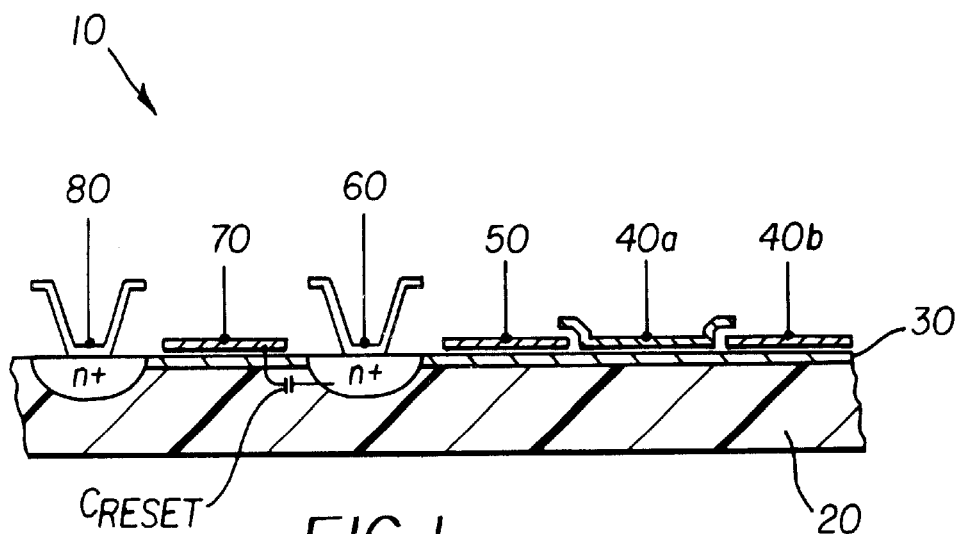
FIG. 1 is a prior art drawing of an image sensor in vertical cross section.
Figure 2:
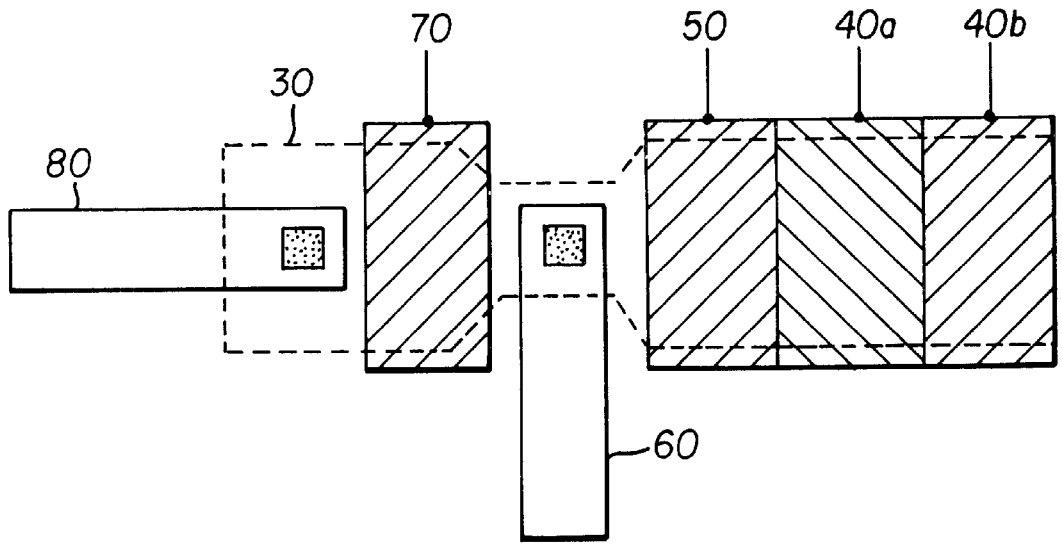
FIG. 2 is a top view of FIG. 1.
Figure 3:
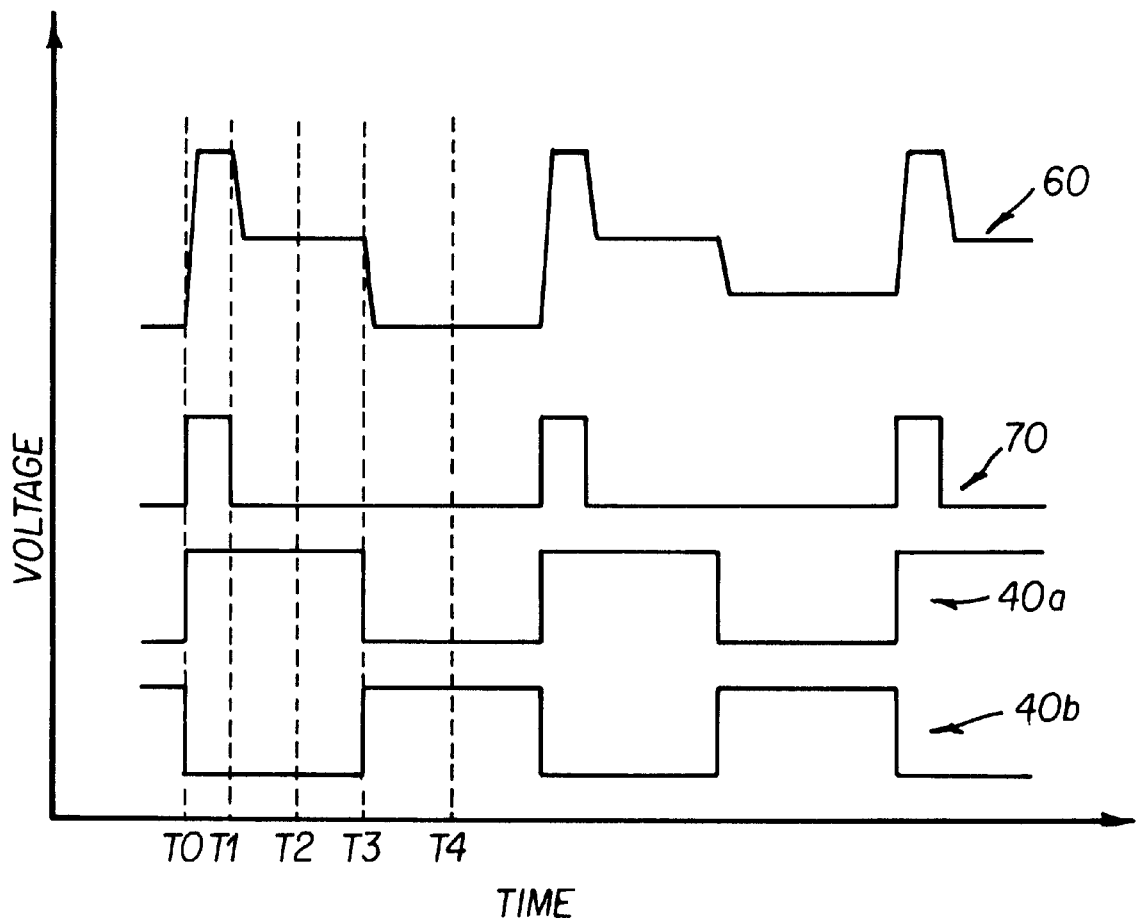
FIG. 3 is a typical timing for the structure of FIGS. 1 and 2.

In the following description, like reference characters designate like or corresponding parts throughout the several views of the drawings. Also in the following description, it is to be understood that such terms as "forward," "rearward," "left," "right," "upwardly," "downwardly," and the like are words of convenience and are not to be construed as limiting terms.

Figure 4:
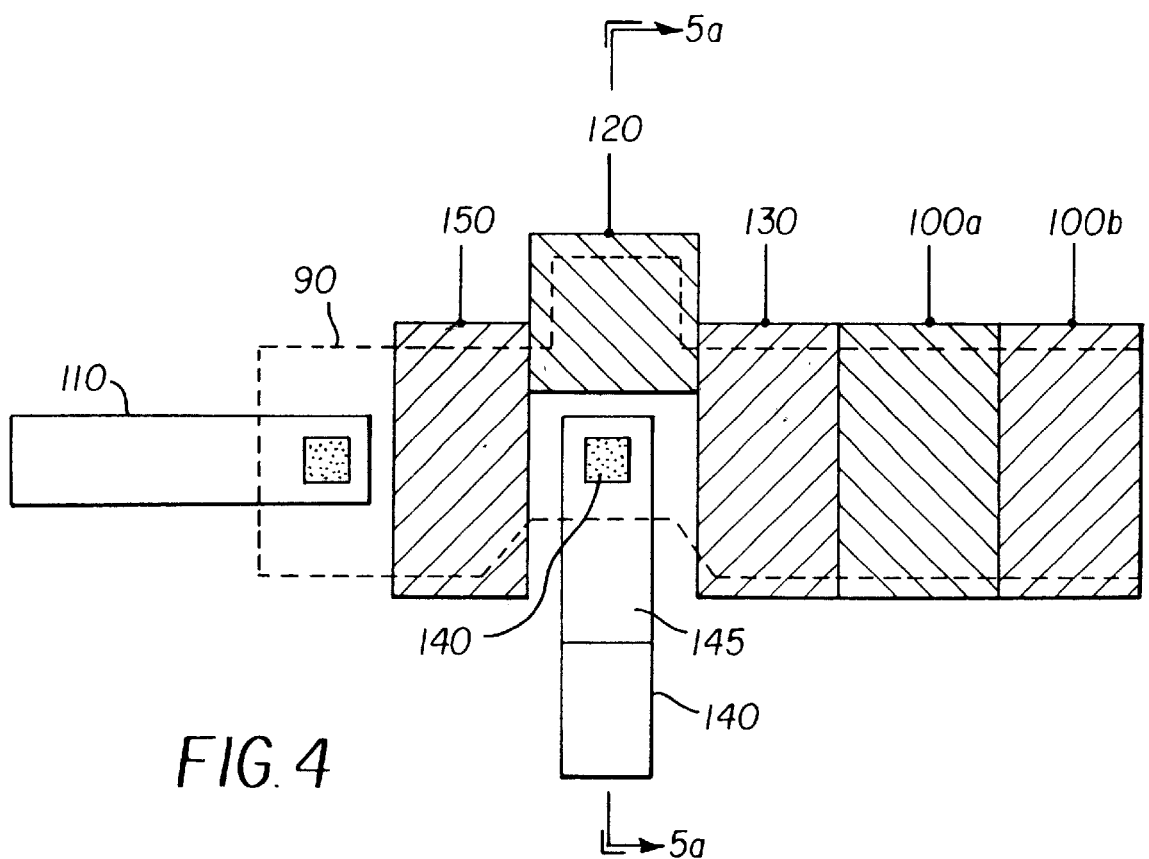
FIG. 4 is a drawing of the image sensor of the present invention in vertical cross section.
Figures 5A, 5B:
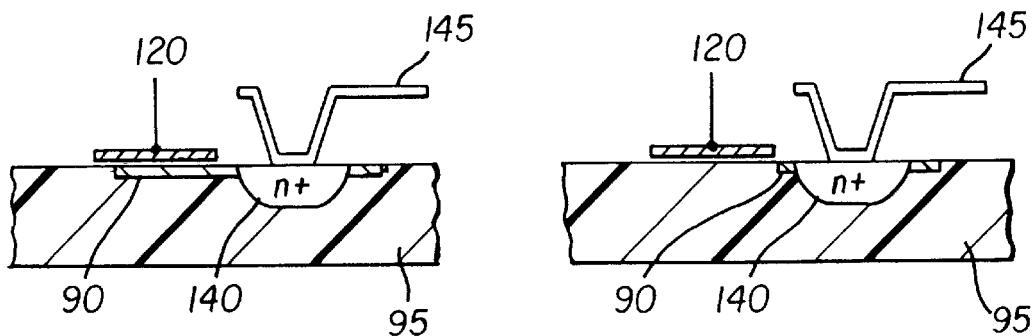
FIGS. 5a and 5b are a view in vertical cross section of a portion of FIG. 4 illustrating alternate positions of the capacitance control gate.

As shown in FIGS. 4 and 5a, the charge-coupled device of the present invention includes a substrate 95 having a n-type buried channel 90 for transferring charge packets of electrons received from the vertical CCD (not shown) in an area imager or from a photodiode (not shown) in the case of linear CCD. A plurality of gates 100 (two gates for the two-phase device shown in FIG. 4) are connected to the buried channel 90 for controlling transferring of charge in the buried channel. The n-type buried channel 90 extends from the gate 100b to the reset drain 110 (underneath the capacitance control gate 120). A non-clocked output gate 130 is positioned between one of the gates 100a and a floating diffusion 140 for preventing capacative coupling of the last clocked gate 100a to the floating diffusion amplifier input 140.

The floating diffusion or amplifier input 140 is adjacent the overflow gate and provides a means for sensing the charge packet size for subsequent measurement via a metal line 145 to an amplifier input 140. A reset transistor 150 is adjacent the amplifier input 140 and provides a mechanism for resetting the charge level of the floating diffusion 140 after appropriate sampling. The reset drain 110 is adjacent the reset transistor for draining the excess charge therefrom.

It facilies understanding to note that, when the voltage on capacitance control gate 120 is low enough such that the channel potential under the capacitance control gate 120 is less than or equal to the reset 150 or output gates, then charge from the buried channel 90 will not collect under the capacitance control gate 120. This provides a floating diffusion capacitance C1. If the voltage on the capacitance control gate 120 is increased to a potential larger than the reset drain 110, then charge from the buried channel 90 will be able to collect underneath the capacitance control gate 120. This provides a larger floating diffusion capacitance value C2. (C2>C1). Thus by changing the voltage on the capacitance control gate, the floating diffusion capacitance may be switched between two values C1 and C2. Then by the relationship V=Q/C, the output voltage change of the floating diffusion for a charge packet of size Q will be V1=Q/C1 or V2=Q/C2 depending on the voltage of the capacitance control gate 120. This provides a method of changing the effective gain of the CCD output. It is to be noted that the capacitance control gate is preferably disposed covering a substantial portion of the of the floating diffusion 140 for achieving the optimum results.

In addition, the capacitance control gate 120 may also be used to eliminate the capacitive coupling between the floating diffusion 140 and the reset gate 150. In this regard, and referring to FIG. 5b, the capacitance control gate is preferably disposed adjacent, but not covering, the floating diffusion 140.

Figure 6:
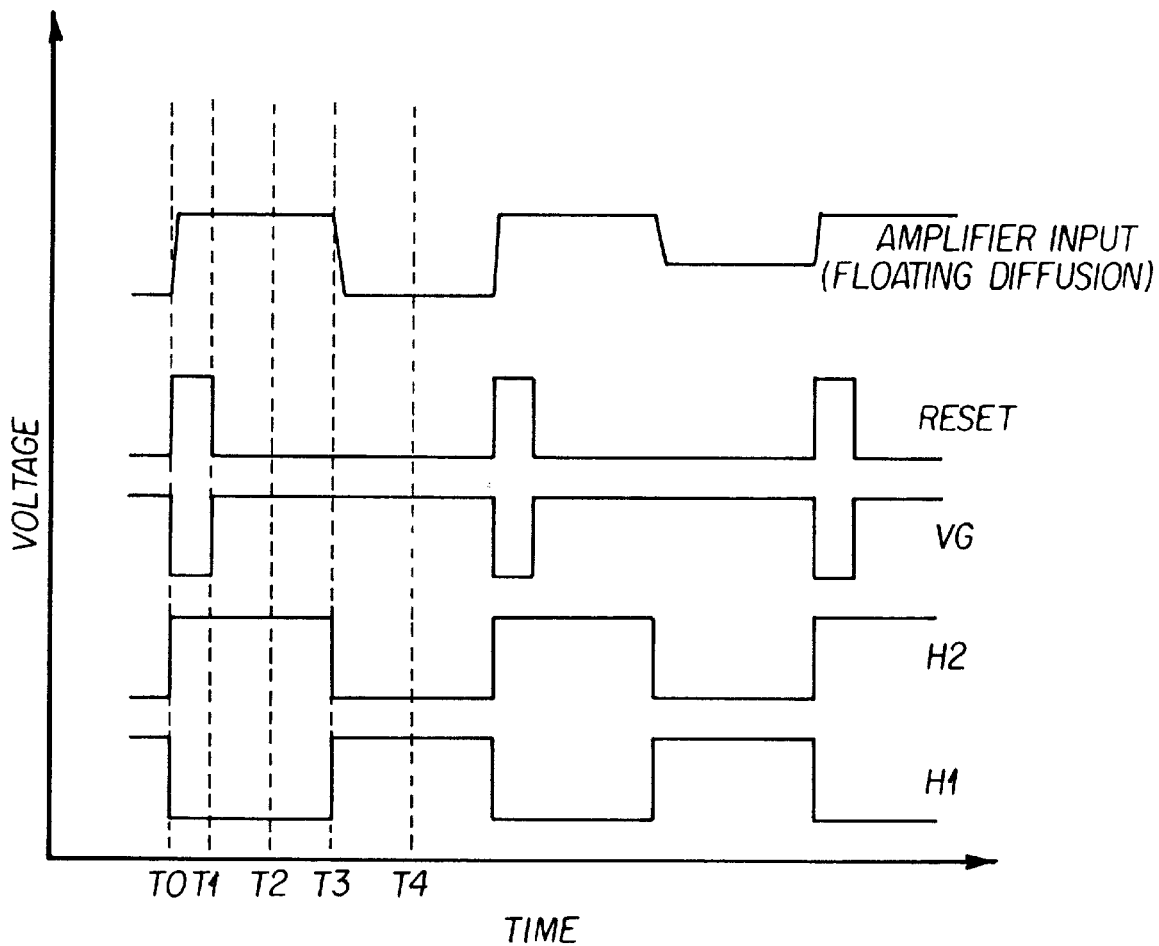
FIG. 6 is a typical timing diagram for the sensor of FIG. 4.

Referring to FIG. 6, the timing sequence is shown for converting a charge packet of electrons from the buried channel 90 to a measurable voltage. At time T0, the reset gate 150 is clocked high. This turns on the reset transistor 150 and resets the floating diffusion 140 to the reset drain reference voltage. The capacitance control gate 120 is pulsed low from time T0 to T1. Since the capacitance control gate 120 is adjacent to the floating diffusion 140, it will have a capacitance to the floating diffusion 140. The capacitive coupling of the negative going pulse on capacitance control gate 120 will cancel out the capacitive coupling of the positive going pulse on reset. This produces a smooth voltage waveform going to the CCD amplifier input (top trace of FIG. 6). The improved waveform is easier for the electronics of cameras to process.

The invention has been described with reference to a preferred embodiment. However, it will be appreciated that variations and modifications can be effected by a person of ordinary skill in the art without departing from the scope of the invention.

Parts list 10 charge-coupled device
20 substrate
30 buried channel
40 gates
50 non-clocked output gate
60 floating diffusion
70 reset gate
80 reset drain
90 buried channel
95 substrate
100 gates
110 reset drain
120 capacitance control gate
130 non-clocked output gate
140 floating diffusion or amplifier input
145 metal line
150 reset gate

What is claimed is:

1. A charge-coupled device comprising:
   (a) a plurality of cells for forming the charge-coupled device, each of the cells capable of retaining charge;
   (b) transfer mechanism within the charge-coupled device for moving charge through the plurality of cells;
   (c) an output region for receiving charge moved through the plurality of cells under control of the transfer mechanism;
   (d) a floating diffusion to receive charge moved across the output region;
   (e) a reset gate to remove charge from the floating diffusion and reset the floating diffusion to a reference voltage level; and
   (f) a capacitance control gate covering a portion of the floating diffusion; wherein a voltage is applied to the capacitance control gate voltage to alter capacitance of the floating diffussion.

2. The charge-coupled device of claim 1 wherein the capacitance control gate is clocked opposite that of the reset gate to cancel the capacitive effects of the reset gate.

* * * * *